United States Patent
Wang et al.

(10) Patent No.: US 7,811,892 B2
(45) Date of Patent: Oct. 12, 2010

(54) MULTI-STEP ANNEALING PROCESS

(75) Inventors: Yun-Ren Wang, Tainan (TW);
Ying-Wei Yen, Miaoli County (TW);
Chien-Hua Lung, Hsinchu County (TW); Shu-Yen Chan, Hsinchu County (TW); Kuo-Tai Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 690 days.

(21) Appl. No.: 11/308,508

(22) Filed: Mar. 31, 2006

(65) Prior Publication Data

US 2007/0082506 A1  Apr. 12, 2007

Related U.S. Application Data

(63) Continuation-in-part of application No. 11/163,218, filed on Oct. 11, 2005.

(51) Int. Cl.
*H01L 21/477* (2006.01)
(52) U.S. Cl. ....................... 438/290; 438/663
(58) Field of Classification Search ................. None
See application file for complete search history.

(56) References Cited

U.S. PATENT DOCUMENTS

| | | | | |
|---|---|---|---|---|
| 6,066,516 | A * | 5/2000 | Miyasaka | 438/149 |
| 6,660,604 | B1 * | 12/2003 | Hwang et al. | 438/305 |
| 6,730,566 | B2 * | 5/2004 | Niimi et al. | 438/275 |
| 2002/0197884 | A1 | 12/2002 | Niimi et al. | |
| 2005/0227439 | A1 | 10/2005 | Adam et al. | 438/275 |
| 2007/0072364 | A1 * | 3/2007 | Visokay et al. | 438/240 |

FOREIGN PATENT DOCUMENTS

| | | |
|---|---|---|
| CN | 1431701 | 7/2003 |
| CN | 1464530 | 12/2003 |
| JP | 2005-285834 | 10/2005 |

OTHER PUBLICATIONS

"A High Density 0.10μm CMOS Technology Using Low K Dielectric and Copper Interconnect" jointly authored by Parihar, et al., Mortorola DigitalDNA Laboratories and AMD Technology Development Group.

* cited by examiner

*Primary Examiner*—Zandra Smith
*Assistant Examiner*—Pamela E Perkins
(74) *Attorney, Agent, or Firm*—Jianq Chyun IP Office

(57) ABSTRACT

A method of fabricating a dielectric layer is described. A substrate is provided, and a dielectric layer is formed over the substrate. The dielectric layer is performed with a nitridation process. The dielectric layer is performed with a first annealing process. A first gas used in the first annealing process includes inert gas and oxygen. The first gas has a first partial pressure ratio of inert gas to oxygen. The dielectric layer is performed with the second annealing process. A second gas used in the second annealing includes inert gas and oxygen. The second gas has a second partial pressure ratio of inert gas to oxygen, and the second partial pressure ratio is smaller than the first partial pressure ratio. At least one annealing temperature of the two annealing processes is equal to or greater than 950° C. The invention improves uniformity of nitrogen dopants distributed in dielectric layer.

31 Claims, 4 Drawing Sheets

MULTI-STEP ANNEALING PROCESS

CROSS-REFERENCE TO RELATED APPLICATION

This application is a continuation-in-part of a prior application Ser. No. 11/163,218, filed Oct. 11, 2005. All disclosure is incorporated herewith by reference.

BACKGROUND OF THE INVENTION

1. Field of Invention

The present invention relates to an annealing process. More particularly, the present invention relates to a multi-step annealing process.

2. Description of Related Art

When the integration for semiconductor device in integrated circuit is getting larger and larger, it is also requited to have super-thin gate dielectric layer with high dielectric constant and low leakage current. When the size of a metal oxide semiconductor (MOS) transistor is less than 100 nm, the dielectric constant usually needs to be greater than 7. The material with higher dielectric constant can improve isolation effect. However, the gate dielectric layer in MOS transistor is formed by silicon oxide, and the dielectric constant for the silicon oxide is about 3.9. The silicon oxide is therefore not suitable for use as the dielectric layer in the MOS device with more and more reduced size. The conventional technology usually uses the nitridation process to dope the dielectric layer of silicon oxide, so as to increase the dielectric constant.

The usual nitridation process includes thermal nitridation process and the plasma nitridation process. The Thermal nitridation process uses the rapid thermal nitridation to dope the nitrogen atoms into the dielectric layer. However, after the thermal nitridation process, the nitrogen dopants are not uniformly distributed in the dielectric layer.

Another nitridation process is the plasma nitridation process. The plasma nitridation process uses the method of ion bombardment to dope the nitrogen atoms into the dielectric layer. However, the plasma nitridation process would cause the nitrogen dopants to be not uniformly distributed in the dielectric layer, and further destroy the surface of the dielectric layer, resulting in the occurrence of direct-tunneling current.

Furthermore, as for the high voltage device in the dual gate device, the threshold voltage distribution is worse caused by uneven the dopant distribution in the channel region. Accordingly, the performance of the high voltage device is seriously affected.

SUMMARY OF THE INVENTION

Accordingly, at least one objective of the present invention is to provide a multi-step annealing process capable of improving the dopant distribution within the material layer after the implantation process is performed on the material layer.

At least another objective of the present invention is to provide a method for forming a high voltage device, wherein the dopant distribution of the channel region under the high voltage gate dielectric layer is more uniform after a multi-step annealing process is performed.

To achieve these and other advantages and in accordance with the purpose of the invention, as embodied and broadly described herein, the invention provides a multi-step annealing process. The multi-step annealing process comprises steps of performing a first annealing process on a material layer with an inert gas at an atmosphere pressure after a plurality of dopants is doped into the material layer and then performing a second annealing process on the material layer with an gas mixture at a low pressure after the first annealing process is performed, wherein the gas mixture comprises the inert gas and an oxygen gas.

According to an embodiment of the invention, in the foregoing multi-step annealing process, the inert gas includes, the inert gas is a nitrogen gas or a noble gas.

According to an embodiment of the invention, in the foregoing multi-step annealing process, the noble gas comprises helium, neon, argon, krypton, xenon, or radon.

According to an embodiment of the invention, in the foregoing multi-step annealing process, the first annealing process is performed at a temperature of about 900~1100 centigrade.

According to an embodiment of the invention, in the foregoing multi-step annealing process, the second annealing process is performed at a temperature of about 1000~1200 centigrade.

According to an embodiment of the invention, in the foregoing multi-step annealing process, the second annealing process is performed under the low pressure of about 1~30 torr.

According to an embodiment of the invention, in the foregoing second annealing process, the partial pressure ratio of the inert gas to the oxygen gas is about 1~100.

According to an embodiment of the invention, in the foregoing multi-step annealing process, the dopants can be selected from a group consisting of boron ions, phosphorus ions, arsenic ions, nitrogen ions, germanium ions and gallium ions.

The invention also provides a method for forming a high voltage device. The method comprises steps of providing a substrate having a high voltage gate dielectric layer formed thereon and a channel region formed therein, wherein the high voltage gate dielectric layer is located right above the channel region in the substrate right and the channel region possesses a first dopant distribution and then performing a multi-step annealing process on the substrate. A conductive layer is formed on the high voltage gate dielectric layer and the conductive layer, the high voltage gate dielectric layer are patterned to form a high voltage gate structure. A source/drain region is formed in the substrate adjacent to the high voltage gate structure. Furthermore, the multi-step annealing process comprises steps of performing a first annealing process on the substrate with an inert gas at an atmosphere pressure and performing a second annealing process on the substrate with an gas mixture at a low pressure after the first annealing process is performed so that the first dopant distribution is transformed into a second dopant distribution, wherein the gas mixture comprises the inert gas and an oxygen gas.

According to an embodiment of the invention, in the foregoing method for fabricating a high voltage device, the inert gas comprises a nitrogen gas or a noble gas.

According to an embodiment of the invention, in the foregoing method for fabricating a high voltage device, the first annealing process is performed at a temperature of about 900~1100 centigrade.

According to an embodiment of the invention, in the foregoing method for fabricating a high voltage device, the second annealing process is performed at a temperature of about 1000~1200 centigrade.

According to an embodiment of the invention, in the foregoing method for fabricating a high voltage device, the second annealing process is performed under the low pressure of about 1~30 torr.

According to an embodiment of the invention, in the foregoing method for fabricating a high voltage device, at the second annealing process, the partial pressure ratio of the inert gas to the oxygen gas is about 1~100.

According to an embodiment of the invention, in the foregoing method for fabricating a high voltage device, the channel region possesses a plurality of dopants selected from a group consisting of boron ions, phosphorus ions, arsenic ions, nitrogen ions, germanium ions and gallium ions.

According to an embodiment of the invention, in the foregoing method for fabricating a high voltage device, the second dopant distribution is smoother than the first dopant distribution.

The invention further provides a method for manufacturing a gate dielectric layer of a dual gate device. The method comprises steps of providing a substrate having a high voltage region and a low voltage region, wherein the substrate further comprises a channel region having a plurality dopants therein at the high voltage region and then forming a high voltage gate dielectric layer in the high voltage region on the channel region of the substrate. A core gate dielectric layer is formed on the high voltage gate dielectric layer in the high voltage region and on the substrate in the low voltage region. A first annealing process is performed on the substrate with an inert gas at an atmosphere pressure. A second annealing process is performed on the substrate with a mixed gas including the inert gas and an oxygen gas at a low pressure right after the first annealing process is performed.

According to an embodiment of the invention, in the foregoing method for fabricating a gate dielectric layer of a dual gate device, after the core gate dielectric layer is formed and before the first annealing process is performed, a nitridation process is performed on the core gate dielectric layer in the low voltage region.

According to an embodiment of the invention, in the foregoing method for fabricating a gate dielectric layer of a dual gate device, the inert gas comprises a nitrogen gas or a noble gas.

According to an embodiment of the invention, in the foregoing method for fabricating a gate dielectric layer of a dual gate device, the first annealing process is performed at a temperature of about 900~1100 centigrade.

According to an embodiment of the invention, in the foregoing method for fabricating a gate dielectric layer of a dual gate device, the second annealing process is performed at a temperature of about 1000~1200 centigrade.

According to an embodiment of the invention, in the foregoing method for fabricating a gate dielectric layer of a dual gate device, the second annealing process is performed under the low pressure of about 1~30 torr.

According to an embodiment of the invention, in the foregoing method for fabricating a gate dielectric layer of a dual gate device, the inert gas is a nitrogen gas or a noble gas.

According to an embodiment of the invention, in the foregoing method for fabricating a gate dielectric layer of a dual gate device, in the second annealing process, the partial pressure ratio of the inert gas to the oxygen gas is about 1~100.

According to an embodiment of the invention, in the foregoing method for fabricating a gate dielectric layer of a dual gate device, the dopants are selected from a group consisting of boron ions, phosphorus ions, arsenic ions, nitrogen ions, germanium ions and gallium ions.

The invention performs at least two annealing processes on the material layer after performing the nitridation process or the implantation process on the material layer. Therefore, the dopants distributed in the material layer can be uniform due to changing the partial pressure ratio of the inert gas to the oxygen in two annealing processes.

In addition, since at least one of the annealing processes is performed under the temperature range of equal to or greater than 950° C., it can mend the dielectric surface, which is destroyed by the plasma during the plasma nitridation process.

In another hand, when the dielectric layer formed in the invention is a gate dielectric layer, the electric performance of the MOS transistor can be improved, including improvements of the equivalent oxide thickness (EOT) and threshold voltage, and so on.

In addition, the invention can extend the application in the process with line width by 90/65 nm, so as to improve the capability of deposition dielectric layer and plasma nitridation process. Further, since the invention can be easily performed, it can be integrated with the current fabrication process, so as to achieve the massive production. Furthermore, since the dopant distribution of the channel region under the high voltage gate dielectric layer is more uniform after the multi-step annealing process is performed, the threshold voltage of the high voltage device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The invention performs at least two annealing processes on the material layer after an implantation process is performed on the material layer. By performing the multi-step annealing process including at least two annealing process, the dopants distributed in the material layer can be uniform.

Figure 1:
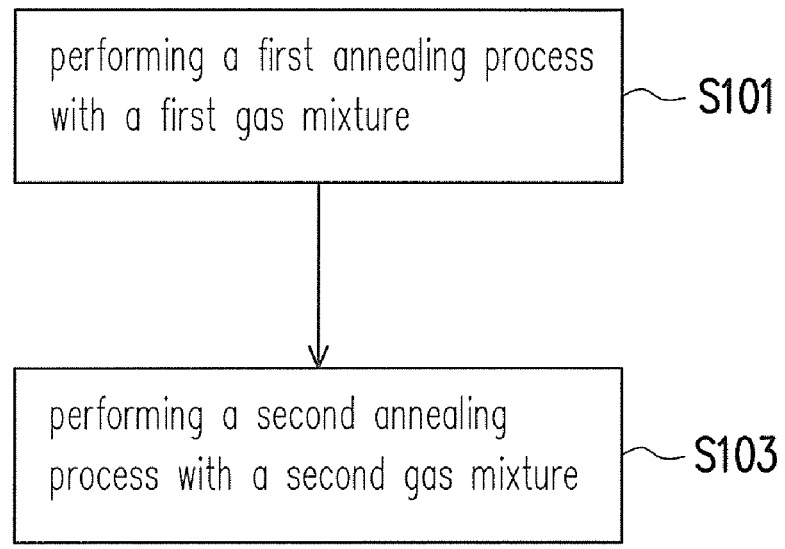
FIG. 1 is a flow chart illustrating the novel multi-step annealing process according to one embodiment of the invention.

FIG. 1 is a flow chart illustrating the novel multi-step annealing process according to one embodiment of the invention.

As shown in FIG. 1, in the step S101, after the dopants are implanted into the material layer, a first annealing process is performed. In the step S103, after the first annealing process is performed, a second annealing process is performed. In the first annealing process, a first gas mixture containing an inert gas and an oxygen gas are used. Similarly, in the second annealing process, a second gas mixture containing the inert gas and the oxygen gas are used as well. At a situation for performing the second annealing process, a first partial pressure ratio (inert gas/oxygen gas)$_1$ for the inert gas to the oxygen gas in the first annealing process is greater than a second partial pressure ratio (inert gas/oxygen gas)$_2$ for the inert gas to the oxygen gas in the second annealing process, as follows:

(inert gas/oxygen gas)$_1$>(inert gas/oxygen gas)$_2$.

At a situation for performing the third annealing process (not shown), the first partial pressure ratio (inert gas/oxygen gas)$_1$ for the inert gas to the oxygen gas in the first annealing process is greater than the second partial pressure ratio (inert gas/oxygen gas)$_2$ for the inert gas to the oxygen gas in the second annealing process. The second partial pressure ratio (inert gas/oxygen gas)$_2$ is less than the third partial pressure ratio (inert gas/oxygen gas)$_3$ for the inert gas to the oxygen gas in the third annealing process, as follows:

(inert gas/oxygen gas)$_1$>(inert gas/oxygen gas)$_2$.

(inert gas/oxygen gas)$_2$<(inert gas/oxygen gas)$_3$.

In the foregoing mathematic relations, the first annealing process and the third annealing process can include the specific condition for only using the inert gas. That is, quantities of (inert gas/oxygen gas)$_1$ and the (inert gas/oxygen gas)$_3$ can be infinity.

In the following descriptions, the embodiments are used for describing the method of the invention for manufacturing a dual gate device.

FIGS. 2A through 2F are cross-sectional views schematically illustrating a method for forming a dual gate device according to one embodiment of the present invention.

Figure 2A:
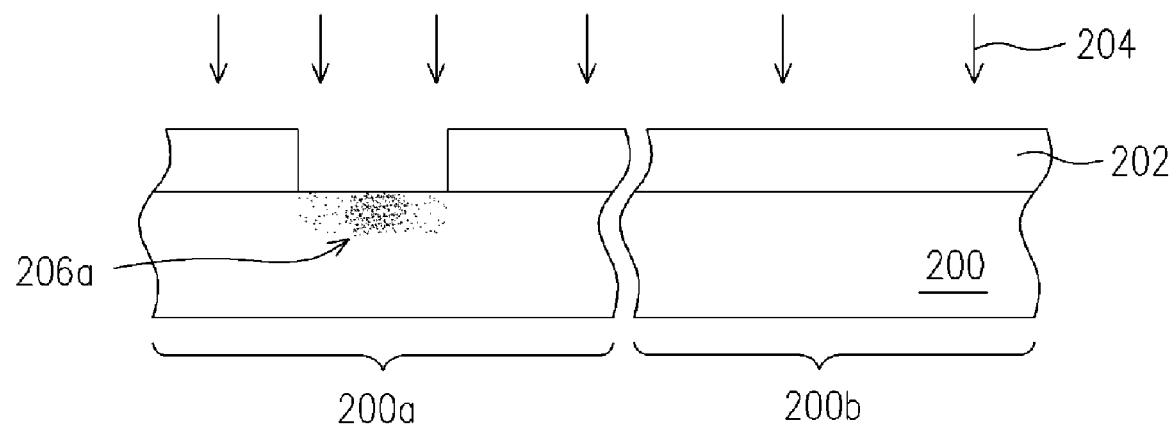
FIGS. 2A through 2F are cross-sectional views schematically illustrating a method for forming a dual gate device according to one embodiment of the present invention.
Figure 2B:
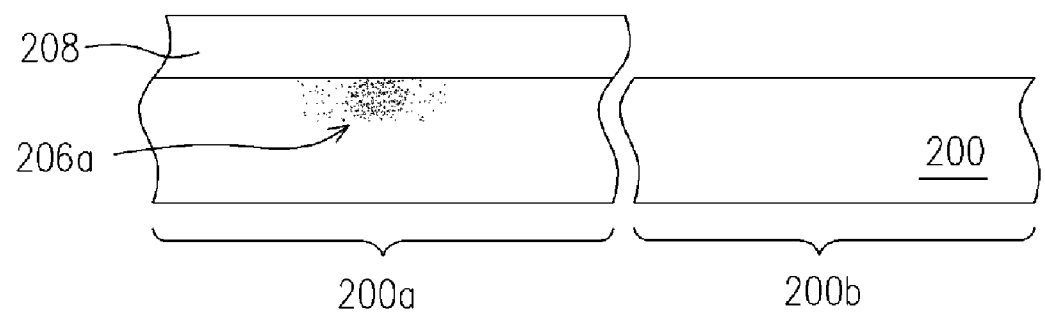

As shown in FIG. 2A, a substrate 200 is provided. The substrate 200 can be, for example, a silicon substrate. The substrate 200 possesses a high voltage region 200a and a low voltage region 200b. The high voltage region 200a and the low voltage region 200b can be, for example but not limited to, isolated from each other by an isolation structure (not shown) formed in the substrate 200. A patterned mask layer 202 is formed on the substrate 200 to expose a portion of the substrate 200 in the high voltage device region 200a. The patterned mask layer 202 can be, for example but not limited to, a photoresist layer. Then, an implantation process 204 is performed to implant dopants into the portion of the substrate 200 exposed by the patterned mask layer 202 so as to from a channel region 206 at the high voltage region 200a in the substrate 200. It should be noticed that the channel region 206 has a first dopant distribution. Furthermore, the dopants used in the implantation process 204 are selected from a group consisting of boron ions, phosphorus ions, arsenic ions, nitrogen ions, germanium ions and gallium ions. Then, as shown in FIG. 2B, a high voltage gate dielectric layer 208 is formed on the substrate 200 in the high voltage region 200a. The thickness of the high voltage gate dielectric layer 208 is about 20~70 angstroms. The high voltage gate dielectric layer 208 can be, for example but not limited to, made from silicon oxide by chemical vapor deposition or thermal oxidation.

Figure 2C:
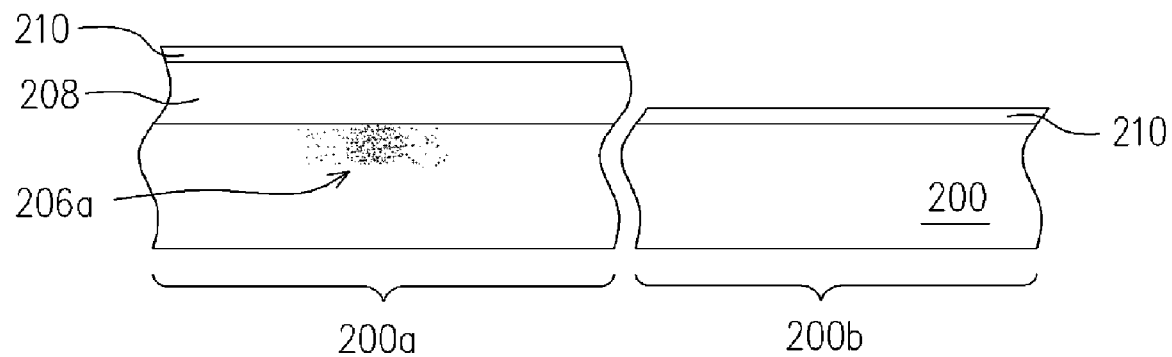

As shown in FIG. 2C, a core gate dielectric layer 210 is formed to cover the substrate 200. That is, the core gate dielectric layer 210 is located on the high voltage gate dielectric layer 208 in the high voltage region 200a of the substrate 200 and is located on a portion of the substrate 200 in the low voltage region 200b.

Figure 2D:
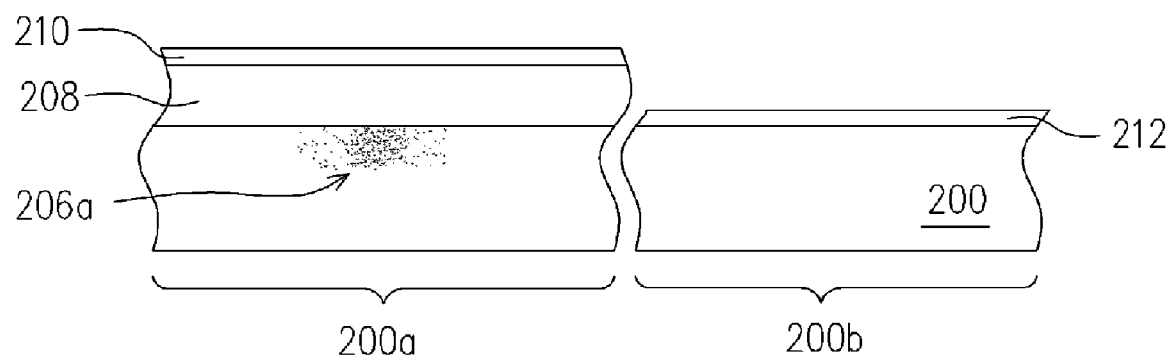

As shown in FIG. 2D, a nitridation process is performed on the core gate dielectric layer 210 in the low voltage region 200b so as to transform the core gate dielectric layer 210 in the low voltage region 200b into a core gate dielectric layer 212 in the low voltage region 200b. The nitridation process being performed includes, for example, the thermal nitridation or plasma nitridation. The gas used in the nitridation process includes, for example, nitrogen-containing gas, such as N, NO or NO$_2$.

Figure 2E:
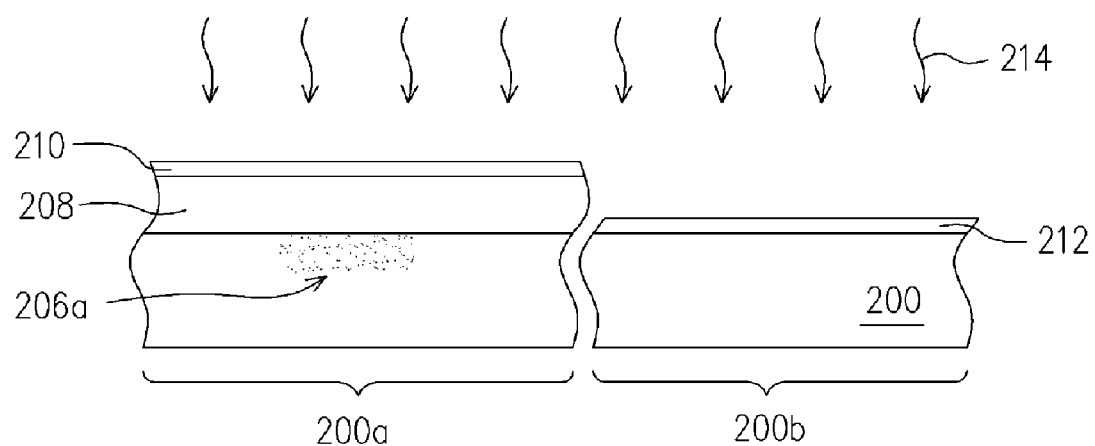

As shown in FIG. 2E together with FIG. 1, a multi-step annealing process 214 is performed so that the channel region 206 (as shown in FIG. 2D) is transformed into a channel region 206a having a second dopant distribution. As shown in FIG. 1, in the multi-step annealing process 214, a first annealing process (step S101) and a second annealing process (step S103) are performed on the substrate 200 sequentially. In the first annealing process, the first gas mixture used in the first annealing process S101 comprises, for example, the inert gas and the oxygen. The inert gas includes, for example, nitrogen or noble gas. The noble gas can be helium, neon, argon, krypton, xenon, or radon. In the first annealing process, a first partial pressure ratio of the inert gas to the oxygen gas is about 9:1. Moreover, the first annealing process is performed under a temperature equal to or greater than 950° C. Preferably, in one embodiment, the first gas mixture only contains the inert gas. Under the circumstance that the first gas mixture only contains inert gas, the first partial pressure ratio is infinity. In another embodiment, the first annealing process is performed, preferably, at the atmosphere pressure and under the temperature of about 900~1100 centigrade. Furthermore, in the other embodiment, the preferred first gas mixture for conducting the first annealing process only contains nitrogen.

After the first annealing process is performed, a second annealing process (step S103) is performed on the substrate 200. In the second annealing process, the second gas mixture used in the second annealing process S103 comprises, for example, the inert gas and the oxygen. The inert gas includes, for example, nitrogen or noble gas. The noble gas can be helium, neon, argon, krypton, xenon, or radon. A second partial pressure ratio of the inert gas to the oxygen gas in the second annealing process is less than the first partial pressure ratio. The second partial pressure ratio is, preferably, about 1~100. Moreover, the second annealing process is performed under a temperature equal to or greater than 950° C. Preferably, the second annealing process is performed, at the low pressure of about 1~30 torr and under the temperature of about 1000~1200 centigrade.

After the multi-step annealing process 214 is performed, the channel region 206 is transformed into the channel region 206a having the second dopant distribution, wherein the second dopant distribution is smoother than the first dopant distribution of the channel 206. That is, after the annealing process is performed, the dopant distribution of the channel region under the high voltage gate dielectric layer is more uniform.

Figure 2F:
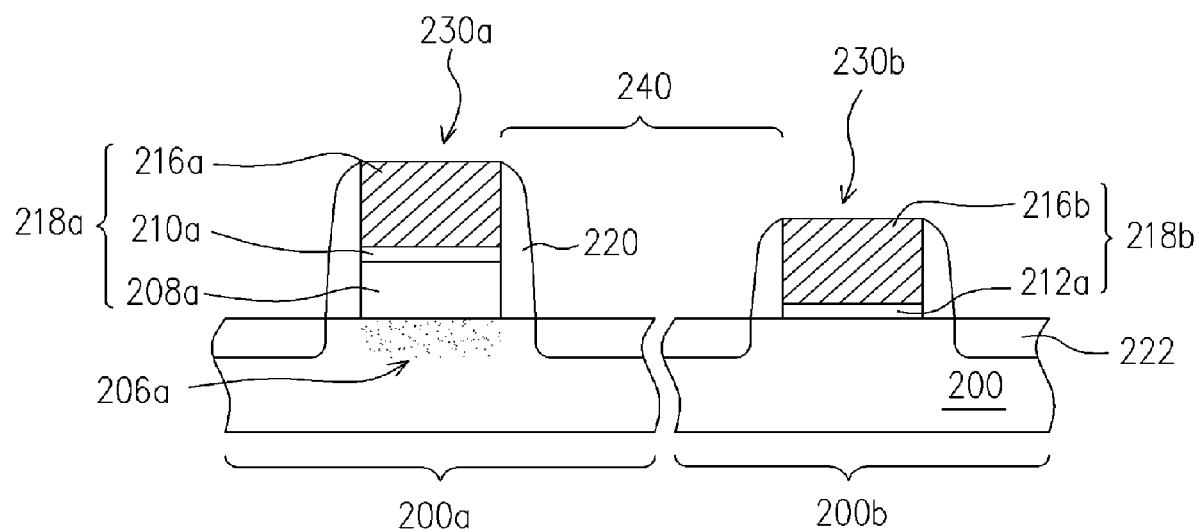

As shown in FIG. 2F, the conventional manufacturing processes are performed to form a high voltage device 230a in the high voltage region 200a and a low voltage device 230b in the low voltage region 200b. The method for forming the high voltage device 230a and the low voltage device 230b comprises steps of forming a conductive layer (not shown) over the substrate 200 and patterning the conductive layer, the core gate dielectric layer 210/210a and the high voltage gate dielectric layer 208 to form a high voltage gate structure 218a and a low voltage gate structure 218b in the high voltage region 200a and the low voltage region 200b respectively. Then, a spacer 220 is formed on the sidewalls of the high voltage gate structure 218a and the low voltage gate structure 218b respectively and a source/drain region 222 is formed in the substrate 200 adjacent to the high voltage gate structure 218a and the low voltage gate structure 218b respectively. Hence, a dual gate device 240 including the high voltage device 230a and the low voltage device 230b is formed.

Since the invention performs at least two annealing processes on the substrate 200, the nitrogen dopants in the core gate dielectric layer 212 can be uniformly distributed by changing the partial pressure ratio of the inert gas to the oxygen gas in two annealing processes. Furthermore, the dopants in the channel 206a under the high voltage gate dielectric layer can be uniformly distributed as well by performing the multi-step annealing process. The present invention is a convenient and low-cost treatment. In addition, during performing the multi-step annealing process, at least one of the annealing processes is performed at a temperature equal to or greater than 950° C., so as to mend the damaged surface of the core gate dielectric layer 212 due to the plasma nitridation process.

In the aforementioned embodiment of the present invention, the multi-step annealing process is performed after the nitridation process is performed. However, the invention is not limited to by the description made herein. The multi-step annealing process can be performed any time as long as it is after the implantation process is performed.

In the foregoing steps, the person with ordinary skill in the art can adjust the foregoing processes according to the actual fabrication condition. For example, the number of annealing processes being performed or the gas being used can be changed. Here, the additional descriptions are omitted.

Since the core gate dielectric layer 212, which is formed by the method of the invention, has the relatively larger dielectric constant, the electrical performance of the MOS transistor can be improved, including the improvements of equivalent oxide thickness and the threshold voltage. Further, after the multi-step annealing process is performed, the dopant distribution of the channel region under the high voltage gate dielectric layer is more uniform. Accordingly, the threshold voltage of the high voltage device is more uniform In addition, the method of the present invention can be applied to the fabrication process with line width of 90/65 nm, so as to improve the capability of deposition dielectric layer and plasma nitridation process. Further, since the invention can be easily performed, it can be integrated with the current fabrication process, so as to achieve the massive production.

In accordance with the foregoing descriptions, the invention at least has the advantages as follows:

1. The nitridation process in the invention can improve the dielectric constant of the silicon oxide and improve the isolation effect of the dielectric layer.

2. The invention performs at least twice of twice of annealing processes on the dielectric layer after performing the nitridation process, the nitrogen dopants can be uniformly distributed in the dielectric layer by changing the partial pressure ratio of the inert gas to the oxygen gas.

3. At least one of the annealing processes is under an environment at temperature range of equal to or greater than 950° C., so as to mend the damaged surface of the dielectric 110 due to the plasma nitridation process.

4. The formation of the dielectric layer as the gate dielectric layer in the invention can improve the electrical performance of the MOS transistor, including the improvements of equivalent oxide thickness and the threshold voltage.

5. The invention can be further applied to the fabrication process by line width of 90/65 nm, so as to increase capability of the deposition of dielectric layer and the plasma nitridation process. Also and, since the invention can be easily performed, it can be integrated with the current fabrication process, so as to achieve the massive production.

6. The dopant distribution of the channel region under the high voltage gate dielectric layer is more uniform so that the threshold voltage of the high voltage device is improved.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A multi-step annealing process, comprising:
   performing a first annealing process on a material layer with a first gas at a first pressure after a plurality of dopants is doped into the material layer, wherein the first pressure is an atmosphere pressure, and the first gas comprises an inert gas; and
   performing a second annealing process on the material layer with a second gas at a second pressure after the first annealing process is performed, wherein the first pressure is greater than the second pressure, and the second gas is a gas mixture comprising the inert gas and an oxygen gas, and wherein, in the second annealing process, the partial pressure ratio of the inert gas to the oxygen gas is about 1~100.

2. The multi-step annealing process of claim 1, wherein the inert gas is a nitrogen gas or a noble gas.

3. The multi-step annealing process of claim 2, wherein the noble gas comprises helium, neon, argon, krypton, xenon, or radon.

4. The multi-step annealing process of claim 1, wherein the first annealing process is performed at a temperature of about 900~1100 centigrade.

5. The multi-step annealing process of claim 1, wherein the second annealing process is performed at a temperature of about 1000~1200 centigrade.

6. The multi-step annealing process of claim 1, wherein the second annealing process is performed under the second pressure of about 1~30 torr.

7. The multi-step annealing process of claim 1, wherein the dopants are selected from a group consisting of boron ions, phosphorus ions, arsenic ions, nitrogen ions, germanium ions and gallium ions.

8. The multi-step annealing process of claim 1 further comprising:
   performing a third annealing process on the material layer with a third gas after the second annealing process is performed, wherein the third gas comprises the inert gas.

9. The multi-step annealing process of claim 8, wherein the third gas is a gas mixture comprising the inert gas and the oxygen gas, and the partial pressure ratio of the inert gas to the oxygen gas in the second gas is less than the partial pressure ratio of the inert gas to the oxygen gas in the third gas.

10. The multi-step annealing process of claim 1, wherein the first gas is a gas mixture comprising the inert gas and the oxygen gas, and the partial pressure ratio of the inert gas to the oxygen gas in the first gas is greater than the partial pressure ratio of the inert gas to the oxygen gas in the second gas.

11. A method for forming a high voltage device, the method comprising:
   providing a substrate having a high voltage gate dielectric layer formed thereon and a channel region formed therein, wherein the high voltage gate dielectric layer is located right above the channel region in the substrate and the channel region possesses a first dopant distribution;
   performing a multi-step annealing process on the substrate, wherein the multi-step annealing process comprises:
   performing a first annealing process on the substrate with a first gas at a first pressure, wherein the first pressure is an atmosphere pressure, and the first gas comprises an inert gas; and performing a second annealing process on the substrate with a second gas at a second pressure after the first annealing process is performed so that the first dopant distribution is transformed into a second dopant distribution, wherein the first pressure is greater than the second pressure, and the second gas is a gas mixture comprising the inert gas and an oxygen gas, and wherein, in the second annealing process, the partial pressure ratio of the inert gas to the oxygen gas is about 1~100;

forming a conductive layer on the high voltage gate dielectric layer;

patterning the conductive layer, the high voltage gate dielectric layer to form a high voltage gate structure; and forming a source/drain region in the substrate adjacent to the high voltage gate structure.

12. The method of claim 11, wherein the inert gas comprises a nitrogen gas or a noble gas.

13. The method of claim 11, wherein the first annealing process is performed at a temperature of about 900~1100 centigrade.

14. The method of claim 11, wherein the second annealing process is performed at a temperature of about 1000~1200 centigrade.

15. The method of claim 11, wherein the second annealing process is performed under the second pressure of about 1~30 torr.

16. The method of claim 11, wherein the channel region possesses a plurality of dopants selected from a group consisting of boron ions, phosphorus ions, arsenic ions, nitrogen ions, germanium ions and gallium ions.

17. The method of claim 11, wherein the second dopant distribution is smoother than the first dopant distribution.

18. The method of claim 11, wherein the multi-step annealing process further comprises:

performing a third annealing process on the substrate with a third gas after the second annealing process is performed, wherein the third gas comprises the inert gas.

19. The method of claim 18, wherein the third gas is a gas mixture comprising the inert gas and the oxygen gas, and the partial pressure ratio of the inert gas to the oxygen gas in the second gas is less than the partial pressure ratio of the inert gas to the oxygen gas in the third gas.

20. The method of claim 11, wherein the first gas is a gas mixture comprising the inert gas and the oxygen gas, and the partial pressure ratio of the inert gas to the oxygen gas in the first gas is greater than the partial pressure ratio of the inert gas to the oxygen gas in the second gas.

21. A method for manufacturing a gate dielectric layer of a dual gate device, comprising:

providing a substrate having a high voltage region and a low voltage region, wherein the substrate further comprises a channel region having a plurality dopants therein at the high voltage region;

forming a high voltage gate dielectric layer in the high voltage region on the channel region of the substrate;

forming a core gate dielectric layer on the high voltage gate dielectric layer in the high voltage region and on the substrate in the low voltage region;

performing a first annealing process on the substrate with a first gas at a first pressure, wherein the first pressure is an atmosphere pressure, and the first gas comprises an inert gas; and performing a second annealing process on the substrate with a second gas at a second pressure right after the first annealing process is performed, wherein the first pressure is greater than the second pressure, and the second gas comprises the inert gas and an oxygen gas, and wherein, in the second annealing process, the partial pressure ratio of the inert gas to the oxygen gas is about 1~100.

22. The method of claim 21, wherein, after the core gate dielectric layer is formed and before the first annealing process is performed, a nitridation process is performed on the core gate dielectric layer in the low voltage region.

23. The method of claim 21, wherein the inert gas comprises a nitrogen gas or a noble gas.

24. The method of claim 21, wherein the first annealing process is performed at a temperature of about 900~1100 centigrade.

25. The method of claim 21, wherein the second annealing process is performed at a temperature of about 1000~1200 centigrade.

26. The method of claim 21, wherein the second annealing process is performed under the second pressure of about 1~30 torr.

27. The method of claim 21, wherein the inert gas is a nitrogen gas or a noble gas.

28. The method of claim 21, wherein the dopants are selected from a group consisting of boron ions, phosphorus ions, arsenic ions, nitrogen ions, germanium ions and gallium ions.

29. The method of claim 21 further comprising:

performing a third annealing process on the substrate with a third gas after the second annealing process is performed, wherein the third gas comprises the inert gas.

30. The method of claim 29, wherein the third gas is a gas mixture comprising the inert gas and the oxygen gas, and the partial pressure ratio of the inert gas to the oxygen gas in the second gas is less than the partial pressure ratio of the inert gas to the oxygen gas in the third gas.

31. The method of claim 21, wherein the first gas is a gas mixture comprising the inert gas and the oxygen gas, and the partial pressure ratio of the inert gas to the oxygen gas in the first gas is greater than the partial pressure ratio of the inert gas to the oxygen gas in the second gas.

* * * * *